US010574229B1

(12) United States Patent
Nandi (10) Patent No.: US 10,574,229 B1
(45) Date of Patent: Feb. 25, 2020

(54) SYSTEM AND DEVICE FOR HIGH-SIDE SUPPLY

(71) Applicant: Tagore Technology, Inc., Arlington Heights, IL (US)

(72) Inventor: Prajit Nandi, Kolkata (IN)

(73) Assignee: Tagore Technology, Inc., Arlington Heights, IL (US)

( * ) Notice: Subject to any disclaimer, the term of this patent is extended or adjusted under 35 U.S.C. 154(b) by 0 days.

(21) Appl. No.: 16/254,949

(22) Filed: Jan. 23, 2019

(51) Int. Cl.
*H03K 17/16* (2006.01)
*H03K 19/017* (2006.01)
*H03K 17/06* (2006.01)

(52) U.S. Cl.
CPC ......... *H03K 17/162* (2013.01); *H03K 17/063* (2013.01); *H03K 19/01735* (2013.01); *H03K 2217/0063* (2013.01); *H03K 2217/0081* (2013.01)

(58) Field of Classification Search
CPC .. H03K 17/063; H03K 17/161; H03K 17/162; H03K 2217/0063; H03K 2217/0081; H03K 19/01714; H03K 19/01735
USPC ........ 327/108, 109, 530, 538, 564, 588, 589
See application file for complete search history.

(56) References Cited

U.S. PATENT DOCUMENTS

| | | | | |
|---|---|---|---|---|
| 5,365,118 A | * | 11/1994 | Wilcox | H02M 1/38 327/109 |
| 5,543,740 A | * | 8/1996 | Wong | H03K 17/063 327/108 |
| 5,627,460 A | * | 5/1997 | Bazinet | G05F 1/618 323/224 |
| 7,741,901 B2 | | 6/2010 | Lu et al. | |
| 8,044,705 B2 | | 10/2011 | Nandi et al. | |
| 8,217,487 B2 | | 7/2012 | Choi et al. | |
| 8,243,476 B2 | | 8/2012 | Ribarich | |
| 8,310,284 B2 | | 11/2012 | Heck | |
| 8,581,638 B2 | | 11/2013 | Chen et al. | |
| 8,593,211 B2 | | 11/2013 | Forghani-Zadeh et al. | |

(Continued)

OTHER PUBLICATIONS

Shihong Park et al., "A Self-Boost Charge Pump Topology for a Gate Drive High-Side Power Supply", IEEE Transactions on Power Electronics, Mar. 2005, vol. 20, No. 2, IEEE, US.

(Continued)

*Primary Examiner* — William Hernandez
(74) *Attorney, Agent, or Firm* — Fleit Intellectual Property Law (57) ABSTRACT

An electrical circuit includes a ground-referenced transistor and a non-ground-referenced transistor configured in a half-bridge topology. The non-ground-referenced power transistor has a first conducting electrode coupled to a high voltage power supply, a control electrode coupled to a high-side pre-driver, and a second conducting electrode coupled to a switch node. The electrical circuit further includes a bootstrapped capacitor having a bottom plate coupled to the second conducting electrode and a top plate coupled to the high-side pre-driver, and an interface coupled to a first sense device for sensing a voltage at the top plate, a second sense device for sensing a voltage at the bottom plate, and a charging device for selectively increasing the voltage at the top plate. The interface controls the charging device based on the voltage at the top plate and the voltage at the bottom plate.

20 Claims, 5 Drawing Sheets

(56) References Cited

U.S. PATENT DOCUMENTS

| | | | |
|---|---|---|---|
| 9,083,257 | B2 | 7/2015 | Tateno et al. |
| 9,667,245 | B2 | 5/2017 | De Rooij et al. |
| 9,685,869 | B1 | 6/2017 | Kinzer et al. |
| 9,705,489 | B2 | 7/2017 | van Otten et al. |
| 9,836,296 | B2 | 12/2017 | Vandikas et al. |
| 9,960,620 | B2 | 5/2018 | Kinzer et al. |
| 9,960,764 | B2 | 5/2018 | Kinzer et al. |
| 10,084,445 | B2 | 9/2018 | de Rooij et al. |
| 10,122,274 | B2 | 11/2018 | Marini et al. |
| 10,135,275 | B2 | 11/2018 | Kinzer et al. |
| 2006/0017466 | A1* | 1/2006 | Bryson ............... H03F 3/2171 326/88 |
| 2009/0058507 | A1 | 3/2009 | Nandi et al. |
| 2010/0271079 | A1 | 10/2010 | Choi et al. |
| 2013/0241621 | A1* | 9/2013 | Forghani-Zadeh ......... H03K 17/08122 327/315 |
| 2014/0070627 | A1 | 3/2014 | Briere et al. |
| 2016/0043072 | A1 | 2/2016 | Vielemeyer et al. |
| 2016/0065072 | A1* | 3/2016 | Xiu ....................... H02M 1/08 323/271 |
| 2016/0380600 | A1 | 12/2016 | Diduck |
| 2017/0324411 | A1* | 11/2017 | Gong .................... H02M 3/07 |
| 2018/0018618 | A1 | 1/2018 | Groseclose |
| 2018/0035259 | A1 | 2/2018 | McCormick |
| 2018/0159529 | A1 | 6/2018 | Reusch et al. |
| 2018/0309435 | A1 | 10/2018 | Sakai et al. |

OTHER PUBLICATIONS

Youhao Xi et al., "Optimization of the Drive Circuit for Enhancement Mode Power GaN FETs in DC-DC Converters", 2012, 978-1-4577-1216-6/12, IEEE, US.

* cited by examiner

SYSTEM AND DEVICE FOR HIGH-SIDE SUPPLY

BACKGROUND

Field

This invention relates generally to active solid-state devices, and more specifically to regulating a voltage of a boot-strapped capacitor that provides a floating voltage to a non-ground referenced power transistor in a circuit having a half-bridge topology.

Related Art

Circuits having a half-bridge topology are well known. Such circuits include a ground referenced power transistor and a non-ground referenced power transistor. Some such circuits include a boot-strapped capacitor that provides a floating voltage to the non-ground referenced power transistor. The power transistors of some such circuits are gallium nitride, high-electron-mobility transistors.

A gallium nitride (hereinafter "GaN") high-electron-mobility transistor (hereinafter "HEMT") is an enhancement-mode device that may be used as a switch. An enhancement-mode HEMT is normally ON when its gate-to-source voltage is 0V. An N-channel, enhancement-mode HEMT turns OFF when its gate-to-source voltage is less than its threshold voltage or when its gate terminal is biased at a negative voltage with respect to its source terminal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
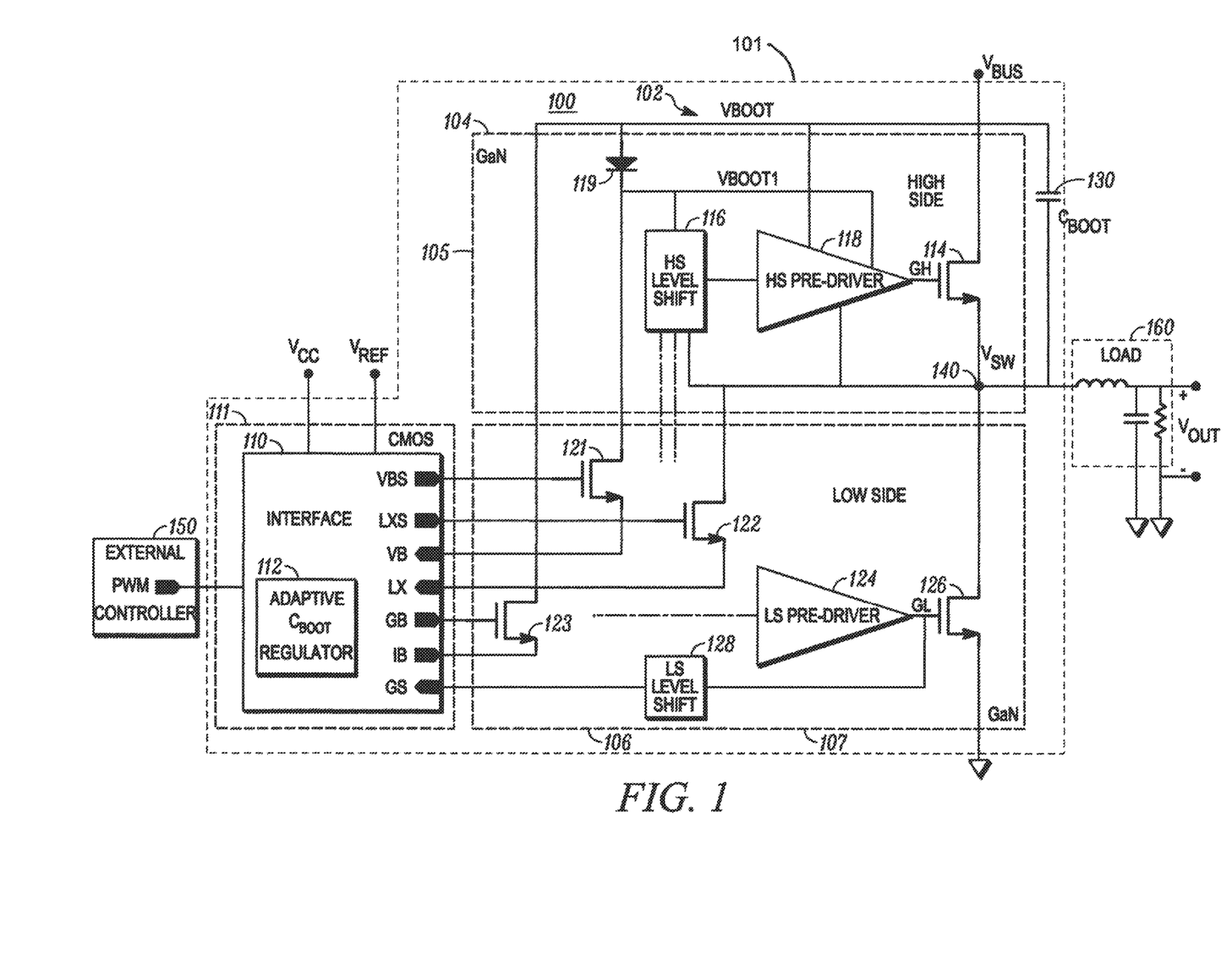
FIG. 1 is a simplified schematic and block diagram of an electrical circuit including a universal half-bridge having a high-side portion and a low-side portion, and an interface portion that includes an adaptive $C_{BOOT}$ regulator for the high-side portion in accordance with the invention.

FIG. 1 is a simplified schematic and block diagram of an electrical circuit 100 including a circuit arranged in a universal half-bridge topology (hereinafter, half-bridge 102) and an interface portion 110 in accordance with the invention. The half-bridge 102 has a high-side portion 104 and a low-side portion 106. The high-side portion 104 is disposed on one circuit-supporting substrate, die or chip 105, and the low-side portion 106 is disposed on another circuit-supporting substrate, die or chip 107. In the illustrated embodiment, chip 105 comprises only devices fabricated using a gallium nitride (GaN) process that are disposed on a first circuit-supporting substrate. In one embodiment, the first circuit-supporting substrate is silicon. In the illustrated embodiment, chip 107 comprises only devices fabricated using a GaN process that are disposed on a second circuit-supporting substrate. In one embodiment, the second circuit-supporting substrate is silicon. The interface portion 110 is disposed on yet another circuit-supporting substrate, die or chip 111. In the illustrated embodiment, chip 111 comprises only devices fabricated using a complementary metal oxide semiconductor (CMOS) process that are disposed on a third circuit-supporting substrate. In one embodiment, the third circuit-supporting substrate is silicon. The interface portion 110 includes an adaptive $C_{BOOT}$ regulator (hereinafter, regulator 112) in accordance with the invention. The interface portion 110 may include other circuitry. In one embodiment, the high-side portion 104, the low-side portion 106 and the interface portion 110 are housed in a same microelectronic package 101 such as a dual-flat no-lead ("DFN") package or a quad-flat no-lead ("QFN") package. The electrical circuit 100 may include other circuitry housed in the same microelectronic package 101.

The high-side portion 104 includes a non-ground-referenced power transistor (hereinafter, high-side transistor 114), a high-side level shift module 116, a high-side pre-driver 118 and a diode 119. The low-side portion 106 includes a first sense device 121, a second sense device 122, a charging device 123, a low-side pre-driver 124 and a ground-referenced power transistor (hereinafter, low-side transistor 126). There is a need for the high-side pre-driver 118 and the low-side pre-driver 124 because the high-side transistor 114 and the low-side transistor 126 are very large and need to be driven via low impedance drivers. A source terminal of the high-side transistor 114 is coupled to a drain terminal of the low-side transistor 126 at a switch node 140 of the half-bridge 102. A drain terminal of the high-side transistor 114 is coupled to a high voltage supply, $V_{BUS}$. A source terminal of the low-side transistor 126 is coupled to ground.

The electrical circuit 100 includes a boot-strapped capacitor (hereinafter, $C_{BOOT}$ 130), coupled between the charging device 123 and the switch node 140 of the half-bridge 102. In the illustrated embodiment, $C_{BOOT}$ 130 is housed within the microelectronic package 101 that houses the half-bridge 102. In another embodiment, $C_{BOOT}$ 130 is housed outside the microelectronic package 101 that houses the half-bridge 102, depending on a size of $C_{BOOT}$. $C_{BOOT}$ 130 functions as a power supply for the high-side transistor 114 of the high-side portion 104. The regulator 112 separately senses voltage at each capacitive plate of $C_{BOOT}$ 130. Based on a difference between a voltage of the top plate of $C_{BOOT}$ 130 and a voltage of the bottom plate of $C_{BOOT}$, the regulator 112 causes the charging device 123 to charge $C_{BOOT}$ 130 as appropriate.

The interface portion 110 is communicatively coupled between an external controller 150 and the half-bridge 102. The interface portion 110 receives a pulse width modulated (PWM) signal from the external controller 150. Examples of the external controller 150 include a microprocessor, a generic power controller, a buck controller, a boost controller, a fly-back controller, a half-bridge controller, and a full-bridge controller. Circuitry (not shown) within the interface portion 110 generates signals that control switching ON and OFF of the high-side transistor 114 and the low-side transistor 126 of the half-bridge 102. Such circuitry is known and will not be described in further detail. A frequency of the PWM signal determines, in part, a frequency of the switching ON and OFF of the high-side transistor 114 and the low-side transistor 126. The switch node 140 is connected to external passive components. This connection depends on an application circuit with which the half-bridge 102 is used. Examples of such an application circuit are a buck converter, a boost converter, a power factor correction converter, and a LLC converter. Of course, when the low-side transistor 126 is ON, the high-side transistor 114 is OFF, and vice versa. During a dead time, both the high-side transistor 114 and the low-side transistor 126 are OFF.

In one embodiment, the high-side transistor 114 of the high-side portion 104 is an N-channel, enhancement-mode, GaN HEMT. A voltage at the switch node 140 can vary between a low voltage level (in a range of −3V to +2V) when the low-side transistor 126 is ON and a high voltage level of $V_{BUS}$ (in a range of 100V to 650V for GaN applications) when the high-side transistor 114 is ON. The voltage at the switch node 140 depends, in part, on the load 160. In other words, the voltage at the source terminal of the high-side transistor 114 can vary between a range of −3V to +2V at some times and up to 650V at other times. To ensure optimal performance of the high-side transistor 114, a gate-to-source voltage of the high-side transistor needs to be regulated to 6V±10% when it is ON. This is accomplished by regulating the voltage at the gate of the high-side transistor 114. Although a gate-to-source voltage of the low-side transistor 126 should also be 6V±10%, it is not difficult to regulate the voltage at the gate of the low-side transistor 126 because the source voltage of the low-side transistor remains fixed at approximately ground potential.

The regulator 112 generates control signals VBS, LXS, GB and IB. Depending on control signals fed to the high-side portion 104 from the regulator 112, a voltage $V_{BOOT1}$ is applied to a gate of the high-side transistor 114. In accordance with the invention, the regulator 112 regulates the value of $V_{BOOT1}$. When the high-side transistor 114 is ON, $V_{BOOT1}=V_{SW}$. This is consistent with the fact that an N-channel, enhancement-mode HEMT turns OFF when its gate-to-source voltage is less than its threshold voltage. When the high-side transistor 114 is ON, the voltage $V_{SW}$ at the switch node 140 can vary, i.e., the voltage at the source terminal of the high-side transistor can vary. However, there is a need to maintain the gate-to-source voltage of the high-side transistor 114 at 6V. Accordingly, the regulator 112 maintains a value of $V_{BOOT1}$ such that $V_{BOOT1}-V_{SW}=6V$ when the high-side transistor 114 is ON.

A GaN device can tolerate up to 650V between drain and source. However, to avoid an increase in drain-to-source resistance when a GaN device is ON the gate-to-source voltage of a GaN device should be 6V. If the gate-to-source voltage of the high-side transistor 114 is less than 6V performance is degraded. If the gate-to-source voltage of the high-side transistor 114 is greater than 6V "soft damage" to the GaN device will occur. In particular, the gate-to-source voltage of the high-side transistor 114 should be limited to 6V. The gate-to-source voltage of the high-side transistor 114 must be high enough to minimize the ON resistance of the high-side transistor but low enough so as to not exceed an allowed reliability limit of the high-side transistor. This restriction in the value of the gate-to-source voltage of the high-side transistor 114 necessitates that the voltage at the gate terminal of the high-side transistor be regulated. The regulation of the voltage at the gate terminal of the high-side transistor 114 is accomplished by first sensing the voltage across $C_{BOOT}$ 130. The gate-to-source voltage of the high-side transistor 114 is controlled in the supply domain of $V_{BOOT1}$. The high-side level shift module 116 shifts control from a CMOS domain in the interface portion 110 to the $V_{BOOT1}$ domain in the GaN in the high-side portion 104. The circuitry within the high-side level shift module 116 is known, and, therefore, will not be described in detail. $V_{BOOT1}$ is the power supply and $V_{SW}$ is the ground for the high-side level shift module 116. $V_{BOOT1}$ is a shifted supply that is equal to ($V_{BOOT}$—threshold voltage of GaN) as a result of diode 119.

The high-side level shift module 116 receives control signals (shown by dotted lines) from a pulse generator located in the interface portion 110. Not shown in FIG. 1, are high-voltage, N-channel, enhancement-mode, GaN HEMTs between the high-side level shift module 116 and the interface portion 110 and located in the low-side chip 107. The two dotted lines emanating from the high-side level shift module 116 represent signal paths for SET and RESET signals. The SET and RESET signals are used by the high-side level shift module 116 to turn ON and OFF, respectively, the high-side transistor 114 of the high-side portion 104. The SET signal causes the high-side pre-driver 118 to apply a voltage to a gate terminal of the high-side transistor 114 at a value to achieve optimum performance.

The high-side level shift module 116 is coupled to the high-side pre-driver 118, and the control signals cause the high-side pre-driver 118 to turn ON and OFF the high-side transistor 114. $V_{BOOT1}$ is one of the power supplies of the high-side pre-driver 118. Another power supply of the high-side pre-driver 118 is a voltage $V_{BOOT}$. The high-side pre-driver 118 functions, in some respects, as an inverter. A cathode of the diode 119 is coupled to the top plate of $C_{BOOT}$ 130 and an anode of the diode is coupled to the high-side level shift module 116 and the high-side pre-driver 118. The purpose of the diode 119 is to assure that $V_{BOOT1}$, which is the output of the high-side pre-driver 118, is at a lower voltage than $V_{BOOT}$, which is the supply voltage of the high-side pre-driver. $V_{SW}$ is the ground for the high-side pre-driver 118. The circuitry within the high-side pre-driver 118 is known, and, therefore, will not be described in detail. The voltage level of $V_{BOOT1}$ needs to be regulated, which is achieved by ensuring a regulated power supply to the high-side level shift module 116 and to the high-side pre-driver 118. The voltage regulated across $C_{BOOT}$ 130 ensures that $V_{BOOT1}$, which turns ON the high-side transistor 114, is a regulated voltage to achieve optimum performance by maintaining a low ON resistance of the high-side transistor 114 without creating device stress. Advantageously, the regulator 112 regulates the voltage across $C_{BOOT}$ 130 to achieve a low ON resistance of the high-side transistor 114 without over stressing it.

In the embodiment illustrated in FIG. 1, the first sense device 121 and second sense device 122 are high-voltage, N-channel, enhancement-mode, GaN HEMTs. In another embodiment (not shown), the first sense device 121 and the second sense device 122 are high-voltage, N-channel, depletion-mode, GaN HEMTs. In another embodiment (not shown), the first sense device 121 is a high-voltage, P-channel, GaN HEMT. The regulator 112 provides control signals to the first sense device 121 and second sense device 122. The regulator 112 also provides control signals to the charging device 123, based on a sensed voltage of both plates of $C_{BOOT}$ 130. Based on the control signals to the charging device 123, the charging device turns ON and provides a charging current to $C_{BOOT}$ 130. In the embodiment illustrated in FIG. 1, the charging device 123 is a high-voltage, N-channel, enhancement-mode, GaN HEMT. Advantageously, no external components are needed to charge $C_{BOOT}$ 130.

A gate voltage GL of the low-side transistor 126 of the low-side portion 106 is inputted to a low-side level shift module 128 which inverts the gate voltage GL and outputs a signal GS to the regulator 112. The regulator 112 uses, in part, the signal GS to regulate a voltage across $C_{BOOT}$ 130. In one embodiment, the low-side transistor 126 of the low-side portion 106 is an N-channel, enhancement-mode, GaN HEMT.

The regulator 112 regulates a voltage across $C_{BOOT}$ 130 by using a switched-capacitor mechanism to separately sense the voltage of the top plate and the voltage of the bottom plate of $C_{BOOT}$. Advantageously, the regulator 112 senses the voltage across $C_{BOOT}$ 130 by simultaneously sensing the top and the bottom plates of $C_{BOOT}$. Even during the charging of $C_{BOOT}$ 130, the regulator 112 ensures that the voltage across $C_{BOOT}$ is regulated to a desired voltage.

The low-side portion 106 includes a low-side pre-driver 124. The dotted line emanating from the low-side pre-driver 124 represents a signal path by which the low-side pre-driver module receives an input signal from the pulse generator located in the interface portion 110. This input signal causes the low-side pre-driver 124 to turn ON and OFF the low-side transistor 126. Any delay that occurs within the low-side pre-driver 124 is accounted for within the regulator 112. If, instead of using the signal GS, the input signal to the low-side pre-driver 124 were used, a delay in the low-side pre-driver 124 would need to be separately accounted for when generating the control signals, GB and IB, for charging $C_{BOOT}$ 130. By sensing the signal GL which is present at the gate of the low-side transistor 126, the delay in the path of the input signal from the pulse generator is accounted for by the regulator 112. The circuitry within the low-side pre-driver 124 is known, and, therefore, will not be described in detail.

The regulator 112 helps in detection of a correct condition at which to start sensing and charging $C_{BOOT}$ 130. Because the low-side transistor 126 is an N-channel, enhancement-mode, GaN HEMT, the low-side transistor is OFF when its gate-to-source voltage is less than its threshold voltage or when its gate terminal is biased at a negative voltage with respect to its source terminal. For example, the low-side transistor 126 is OFF when the signal GL is −0.5V. A HIGH signal GL means that the low-side transistor 126 is ON and that the top and the bottom plates of $C_{BOOT}$ 130 are at a low voltage. The circuits of the interface portion 110 are designed using low voltage devices; therefore, when the sensing of the voltage of $C_{BOOT}$ is enabled, it is imperative that sense voltage is lower than a breakdown voltage of the low voltage devices of the interface portion. For example, if the breakdown voltage is 20V, then the regulator 112 ensures that the first sense device 121, the second sense device 122 and the charging device 123 are not enabled until a voltage at their drain terminals are below 20V. When the voltage at the top and bottom plates of $C_{BOOT}$ are below 20V, such voltages can be sensed by the regulator 112 without creating a reliability problem.

Figure 2:
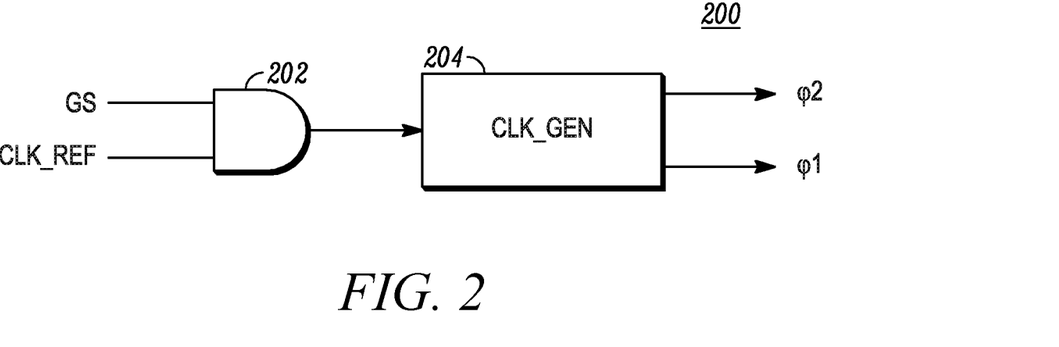
FIG. 2 is a simplified schematic of clock-generating circuitry, located within the adaptive $C_{BOOT}$ regulator, which generates clock signals.

FIG. 2 is a simplified schematic of clock-generating circuitry 200, located within the regulator 112, which generates two non-overlapping clock signals φ1 and φ2 from a single clock signal. The clock signals φ1 and φ2 have a same frequency as the frequency of the PWM signal that the interface portion 110 receives from an external controller. The clock-generating circuitry 200 generates clock signals φ1 and φ2 using, in part, the signal GS which is derived from the gate voltage of the low-side transistor 126. The clock-generating circuitry 200 includes an AND gate 202 having one input terminal for receiving the signal GS and having another input terminal for receiving a clock reference signal, CLK_ref. An output terminal of the AND gate 202 is coupled to a CLK_GEN module 204. The CLK_GEN module 204 includes first and second output terminals at which the CLK_GEN module outputs the clock signals φ1 and φ2, respectively. The clock signal φ1 transitions to LOW a pre-selected first delay after the signal GS transitions to HIGH and then transitions to HIGH a pre-selected second delay after the signal GS transitions to LOW. The clock signal φ2 transitions to HIGH a pre-selected third delay after the signal GS transitions to HIGH and then transitions to LOW when the signal GS transitions to LOW, wherein the pre-selected third delay is longer than the pre-selected first delay. The aforementioned delays are unrelated to the dead time during which the high-side transistor 114 and the low-side transistor 126 are both OFF. Because the control signals VBS and LXS are generated using a boot-strapping mechanism, a refresh clock CLK_ref is inputted to the clock-generating circuitry 200 to allow for low frequency operation. The clock phases φ1 and φ2 are used within first voltage generating circuit 400 and second voltage generating circuit 500 (see FIGS. 4 and 5).

Figure 3:
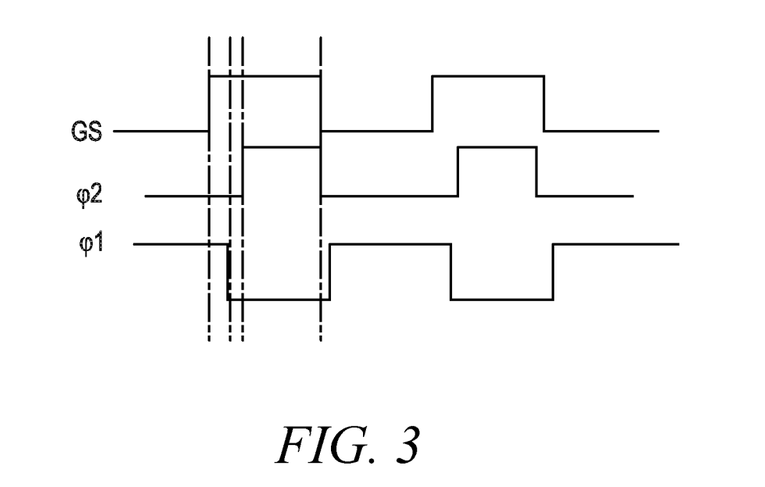
FIG. 3 is a graph of signals that appear in the clock-generating circuitry of FIG. 2.

FIG. 3 is a graph of signals GS, φ1 and φ2 that appear in the clock-generating circuitry 200.

Figure 4:
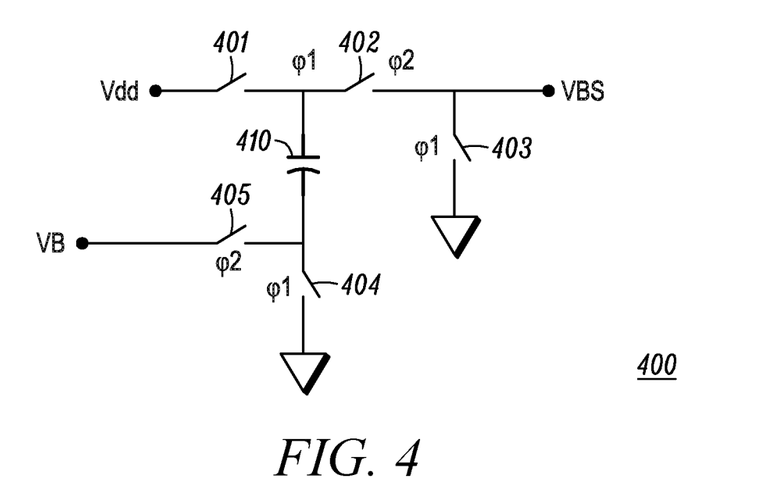
FIG. 4 is a simplified schematic of a first voltage generating circuitry, located within the adaptive $C_{BOOT}$ regulator, which generates a gate voltage and a source voltage for a first sense device located in the high-side portion of the universal half-bridge.

FIG. 4 is a simplified schematic of a first voltage generating circuitry 400, located within the regulator 112. The first voltage generating circuitry 400 is a switched-capacitor based sensing mechanism that generates a gate voltage and a source voltage for the first sense device 121. The first voltage generating circuitry 400 generates, on node VB, a floating 6V/0V gate-to-source voltage to control the first sense device 121. When VBS−VB=6V, the first sense device 121 is ON, and, when VBS−VB=0V, the first sense device is OFF. A turn-on voltage of 6V is applicable to the enhancement mode GaN FET used in the illustrated embodiment. The turn-on voltage could vary if the first sense device 121 is different type of transistor such as high-voltage, depletion mode GaN FET or a MOS transistor. The first voltage generating circuitry 400 is coupled to the first and second output terminals of the clock-generating circuitry 200 and receives clock signals φ1 and φ2 therefrom. The first voltage generating circuitry 400 includes an input terminal for receiving voltage $V_{DD}$ and another input terminal for receiving control signal VB from a source terminal of the first sense device 121 located in the high-side portion 104 of the half-bridge 102. The first voltage generating circuitry 400 includes switches 401, 402, 403, 404 and 405, and capacitor 410. The first voltage generating circuitry 400 generates a voltage at capacitor 410 based on a value of $V_{DD}$, based a value of the signal VB and based on the state of switches 401, 402, 403, 404 and 405. The states of the switches are controlled by the clock signals φ1 and φ2, which bootstrap capacitor 410 over the voltage VB. The voltage at capacitor 410 is the signal VBS which is coupled to a gate of the first sense device 121. The clock reference signal, CLK_ref, shown in FIG. 2, ensures that the capacitor 410 is replenished periodically to sustain the voltages developed in the control signal VB. The first voltage generating circuitry 400 generates a floating node VB of 6V/0V gate-to-source voltage to control the first sense device 121. When the (VBS−VB) is 6V the first sense device 121 will be ON, and when (VBS−VB) is 0V the first sense device will be OFF. A turn-on voltage of 6V is applicable to the enhancement mode GaN FET used in the illustrated embodiment. The turn-on voltage could vary if the first sense device 121 is different type of transistor such as high-voltage, depletion mode GaN FET or a MOS transistor.

Figure 5:
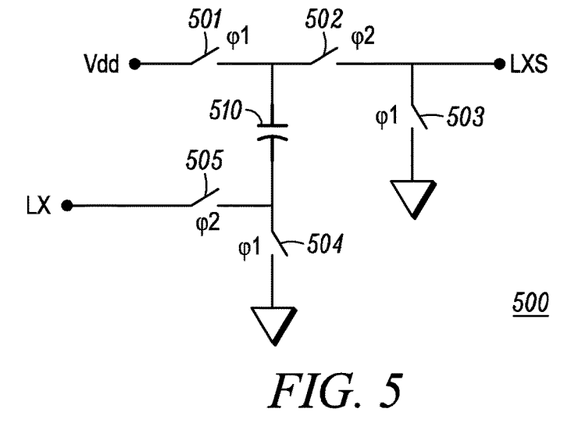
FIG. 5 is a simplified schematic of a second voltage generating circuitry, located within the adaptive $C_{BOOT}$ regulator, which generates a gate voltage and a source voltage for a second sense device located in the high-side portion of the universal half-bridge.

FIG. 5 is a simplified schematic of a second voltage generating circuitry 500, located within the regulator 112. The second voltage generating circuitry 500 is a switched-capacitor based sensing mechanism that generates a gate voltage and a source voltage for the second sense device 122. The second voltage generating circuitry 500 is coupled to the first and second output terminals of the clock-generating circuitry 200 and receives clock signals φ1 and φ2 therefrom. The second voltage generating circuitry 500 includes an input terminal for receiving voltage $V_{DD}$ and another input terminal for receiving control signal LX from a source terminal of the second sense device 122 located in the high-side portion 104 of the half-bridge 102. The second voltage generating circuitry 500 includes switches 501, 502, 503, 504 and 505, and capacitor 510. The second voltage generating circuitry 500 generates a voltage at capacitor 510 based on $V_{DD}$, based on the signal LX and based on the switching of switches 501, 502, 503, 504 and 505. The states of the switches are controlled by the clock signals φ1 and φ2, which bootstrap capacitor 510 over the voltage LX. The voltage at capacitor 510 is the signal LXS which is coupled to a gate of the second sense device 122. The refresh clock CLK_ref ensures that the capacitor 510 is replenished periodically to sustain the voltages developed in the control signal LXS. The second voltage generating circuitry 500 generates a floating node LX of 6V/0V gate-to-source voltage to control the second sense device 122. When the (LXS−LX) is 6V the second sense device 122 will be ON, and when (LXS−LX) is 0V the second sense device will be OFF. A turn-on voltage of 6V is applicable to the enhancement mode GaN FET used in the illustrated embodiment. The turn-on voltage could vary if the second sense device 122 is different type of transistor such as high-voltage, depletion mode GaN FET or a MOS transistor.

A sensing and charging phase of the regulator 112 occurs when the low-side transistor 126 is ON. During the sensing and charging phase, the first sense device 121 senses the voltage on the top plate of $C_{BOOT}$ 130 and the second sense device 122 simultaneously senses the voltage on the bottom plate of $C_{BOOT}$ 130. Advantageously, the regulator 112 regulates the voltage on the top plate with respect to the voltage on the bottom plate. The voltage on the bottom plate of $C_{BOOT}$ 130 is $V_{SW}$, which is the voltage of the switch node 140 of the half-bridge 102.

When the high-side transistor 114 is ON, $C_{BOOT}$ gets discharged based on power consumption of the high-side level shift module 116 and power consumption of the high-side pre-driver 118. These power consumptions are a function of temperature and process variation in the high-side chip. Depending upon the ON time of the high-side transistor 114 (and the power consumptions of said high-side modules) the voltage across $C_{BOOT}$ 130 may vary. Once the low-side transistor 126 turns ON, the regulator 112 replenishes the charge across $C_{BOOT}$ 130 to the desired voltage.

The voltages $V_{BOOT}$, $V_{BOOT1}$ and $V_{SW}$ can be as high as 650V when the low-side transistor 114 is OFF. The CMOS devices (not shown) in the interface portion 110 operate with a $V_{CC}$ in a range of 12V to 20V and they cannot tolerate the high voltages present in the high-side portion 104 of the half-bridge 102. Accordingly, the first sense device 121, the second sense device 122 and the charging device 123 advantageously isolate the CMOS devices in the interface portion 110 from high voltages in the high-side portion 104. When the high-side portion 104 is ON, the first sense device 121 and the second sense device 122 are turned OFF thereby protecting the CMOS devices in the interface portion 110 from the high voltage levels of $C_{BOOT}$ 130. On the other hand, when the low-side transistor 114 is ON, the voltage at the switch node 140 is no longer at a high voltage level. The voltage across $C_{BOOT}$ 130 can be sensed and recharged (if needed) when the low-side portion 104 is ON. When the low-side portion 106 is ON, i.e., during the sensing and charging phase, $V_{SW}$ can vary between −3 and +2V in some embodiments. The negative end (−3V) of this range is limited by the threshold voltage of GaN. When the low-side current goes negative, the maximum negative voltage possible is (−1× threshold of the low-side transistor 126). The positive end (+2V) of this range is determined by the ON resistance of the low-side transistor 114. For example, when $V_{SW}$ is −3V, the regulator 112 adjusts $V_{BOOT1}$ to +3V so that ($V_{BOOT1}$−$V_{SW}$) remains at 6V. For another example, when $V_{SW}$ is +2V the regulator 112 adjusts $C_{BOOT1}$ to +8V so that ($V_{BOOT1}$−$V_{SW}$) remains at 6V. The preceding is a description of the sensing and charging phase of the regulator 112 which occurs when the low-side transistor 126 is ON. Accordingly, following this example, when $V_{SW}$ is +550V, $C_{BOOT1}$ is +556V such that ($V_{BOOT1}$−$V_{SW}$) advantageously equals 6V. Once the low-side transistor 126 is OFF the value of $V_{SW}$ could change from −Ve to 650V (depending on application) but the value of ($V_{BOOT1}$−$V_{SW}$) is advantageously maintained at 6V±10%. The regulator 112 ensures that $C_{BOOT}$ 130 gets charged to 6V during the sensing and charging phase. Once $C_{BOOT}$ 130 is charged to 6V, the regulator 112 stops charging $C_{BOOT}$ even if the low-side is ON but the regulator continuously senses the voltage across $C_{BOOT}$. Once the low-side transistor 126 is OFF, charging and sensing stops and the voltage across $C_{BOOT}$ 130 slowly drops because some of the charge in $C_{BOOT}$ will be taken by the high-side circuitry. Advantageously, the circuits in accordance with the invention are designed such that the voltage across $C_{BOOT}$ 130 does not drop more than 10% below 6V in a worst case while the low-side is OFF.

$V_{DD}$ is an internal regulated voltage that ensures the gate-to-source voltage of the first sense device 121 and the second sense device 122 is optimal and controlled. In one embodiment, $V_{DD}$ is 6V. $V_{DD}$ is generated within the interface portion 110 from $V_{CC}$. $V_{DD}$ is selected to have a value so as to ensure that the ON resistance of the first sense device 121 and the ON resistance of the second sense device 122 remain constant during the sensing and charging phase, thus, advantageously reducing non-linearity in the half-bridge 102.

The gate-to-source voltage of the first sense device 121 is produced by the first voltage generating circuitry 400. The gate-to-source voltage of the second sense device 122 is produced by the second voltage generating circuitry 500. The boot-strapped capacitors 410 and 510 are charged to $V_{DD}$ when φ1 is HIGH and φ2 is LOW. During the sensing and charging phase, which occurs when φ2 is HIGH and φ1 is LOW, the voltage, $V_{DD}$, of the boot-strapped capacitors 410 and 510 maintains the gate-to-source voltage across the first sense device 121 and the second sense device 122, respectively. The voltage, $V_{DD}$, of the boot-strapped capacitors 410 and 510 should be optimal to ensure low ON resistances of the first sense device 121 and the second sense device 122 which, in turn, ensure that the voltage of the top and bottom plates of $C_{BOOT}$ 130 are sensed correctly.

Figure 6:
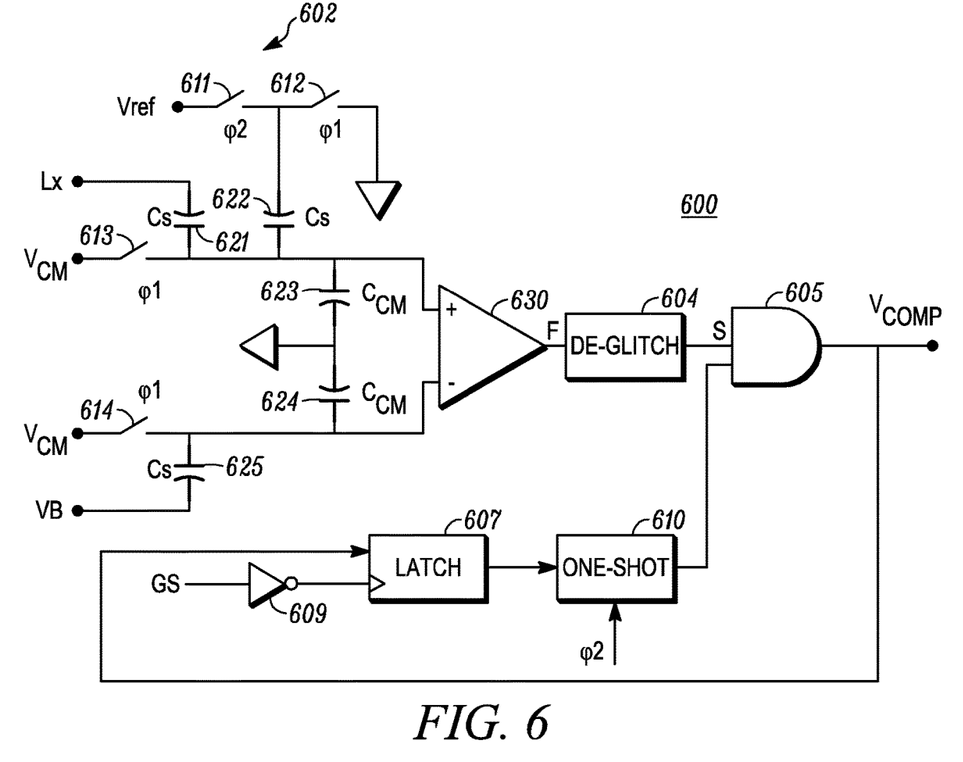
FIG. 6 is a simplified schematic and block diagram of comparison signal-generating circuitry, within the adaptive $C_{BOOT}$ regulator shown in FIG. 1, which includes a de-glitch module and a one-shot module and which generates a comparison signal.

FIG. 6 is a simplified schematic and block diagram of comparison signal-generating circuitry 600 located within the regulator 112. The comparison signal-generating circuitry 600 includes a switched-capacitor comparator network 602, a de-glitch module 604, an AND gate 605, a latch 607, an inverter 609 and a one-shot module 610.

The charging control of $C_{BOOT}$ 130 is achieved by the switched-capacitor comparator network 602. The switched-capacitor comparator network 602 includes input nodes for receiving the VB signal from the source terminal of the first sense device 121, the signal LX from the source terminal of the second sense device 122, a voltage $V_{REF}$, and a common-mode signal $V_{CM}$. The switched-capacitor comparator network 602 includes switches 611, 612, 613 and 614, which are controlled by the clock signals φ1 and φ2. The switched-capacitor comparator network 602 includes capacitors 621, 622, 623, 624 and 625. The switched-capacitor comparator network 602 has a gain of "2" which is determined, in part, by the values of capacitors 621, 622, 623, 624 and 625. The switched-capacitor comparator network 602 includes a comparator 630 that gives an output "1" if $V_B-LX<2V_{REF}$. When the low-side transistor 126 is ON (corresponding to clock signal φ2 being HIGH) the comparator 630 gives an output "1" ($V_{COMP}=1$) if $V_B-LX<2V_{REF}$. A voltage at a drain terminal of the first sense device 121 is equal to the voltage of the top plate of $C_{BOOT}$ 130. A voltage at the drain terminal of the second sense device 122 is equal to the voltage of the bottom plate of $C_{BOOT}$ 130. If a difference between the voltage of the top plate of $C_{BOOT}$ 130 and the voltage of the bottom plate of $C_{BOOT}$ is less than the desired voltage, then the output of the comparison signal-generating circuitry is $V_{COMP}=1$, which turns ON the charging device 123 using the circuitry shown in FIGS. 7 and 9. $V_{COMP}=1$ signifies that $C_{BOOT}$ 130 is being charged. The desired voltage, i.e., 6V, across $C_{BOOT}$ 130 is determined by selecting a value for $V_{REF}$. In one embodiment, $V_{REF}=3V$. The switched-capacitor comparator network 602 outputs a first intermediate signal, F.

An output terminal of the switched-capacitor comparator network 602 is coupled to an input terminal of the de-glitch module 604. The internal circuitry of the de-glitch module 604 is conventional and will not be described in detail. Typically, a universal half-bridge is noisy because of high power switching. The de-glitch module 604 ensures that any high frequency noise in the half-bridge 102 does not falsely turn ON the charging device 123. The de-glitch module 604 removes any spurs that may be present in a signal outputted by the comparator 630 caused by noise from power supplies. The de-glitch module 604 is needed because an output signal of the comparator 630 can be initially erroneous while sensing is occurring. In high voltage circuits, when the first sense device 121 and second sense device 122 turn-on due to ringing on the top and bottom plates of $C_{BOOT}$ 130, there would be incorrect sensing which can cause the output of the comparator 630 to chatter which could cause the charging device 123 to undesirably turn ON and OFF. The de-glitch module 604 filters out the chattering and avoids the charging device 123 from undesirably turning ON and OFF. The de-glitch module 604 outputs a second intermediate signal, S.

An output terminal of the de-glitch module 604 is coupled to one input terminal of the AND gate 605. The AND gate 605 generates a comparison signal $V_{COMP}$ that is fed into an input terminal of the latch 607. The signal GS from the low-side level shift module 128 is fed into the inverter 609. An output of the inverter 609 is fed into a clock input of the latch 607. An output terminal of the latch 607 is coupled to an input terminal of the one-shot module 610. In one embodiment, the latch 607 comprises an edge-triggered D-flip-flop, and the comparison signal $V_{COMP}$ is fed into a D-terminal of the edge-triggered flip-flop, and a Q-terminal of the edge-triggered flip-flop is coupled to the input terminal of the one-shot module 610. An output terminal of the one-shot module 610 is coupled to another input terminal of the AND gate 605. The internal circuitry of the one-shot module 610 is conventional and will not be described in detail. The one-shot module 610 includes another terminal for receiving the clock signal φ2 from the clock-generating circuitry 200. The one-shot module 610 permits the charging of $C_{BOOT}$ 130 without waiting for feedback based on sensed voltages which indicate that, in a previous cycle, the charging of $C_{BOOT}$ was not completed. The one-shot module 610 reduces the charging time of $C_{BOOT}$ 130. The one-shot module 610 ensures that the charging of $C_{BOOT}$ 130 begins without waiting for the comparator 630 to sense and decide. If and only if the charging of $C_{BOOT}$ 130 is not complete in any cycle, then the one-shot module 610 starts to charge $C_{BOOT}$ in the next cycle without waiting for the comparator 630 to output "1". If the charging of $C_{BOOT}$ 130 remained incomplete due to the low-side transistor 126 turning OFF, then, in a subsequent cycle when the low-side transistor 126 turns ON again, the charging is started immediately, because, during an intermediate interval, $C_{BOOT}$ would have discharged further. The one-shot module 610 enables a higher frequency of operation compared to known circuits. The one-shot module 610 enables supporting a higher load current from $C_{BOOT}$ 130 compared to known circuits.

The regulator 112 stores a latest state of $V_{COMP}$ in the latch 607. If the state of the latch 607 indicates that the charging in a previous cycle is incomplete, the regulator 112 starts charging $C_{BOOT}$ 130 without waiting for a decision by the comparator 630. A combined duration of sensing the voltage across $C_{BOOT}$ 130 and duration of charging $C_{BOOT}$ is limited in the event that the ON time of low-side transistor 126 is short relative to the ON time of the high-side transistor 114. The comparison signal-generating circuitry 600 has a significant internal delay which leads to a longer duration of sensing. Therefore, at times, the duration of charging is insufficient (because charging occurs only during the ON time of the low-side transistor 126). Consequently, in such event, the one-shot module 610 generates a charging pulse, $V_{COMP}$, which supersedes the output signal of the comparator 630, to begin charging $C_{BOOT}$ 130 at the very start of a next cycle. The comparison signal-generating circuitry 600 outputs the charging pulse $V_{COMP}$.

Figure 7:
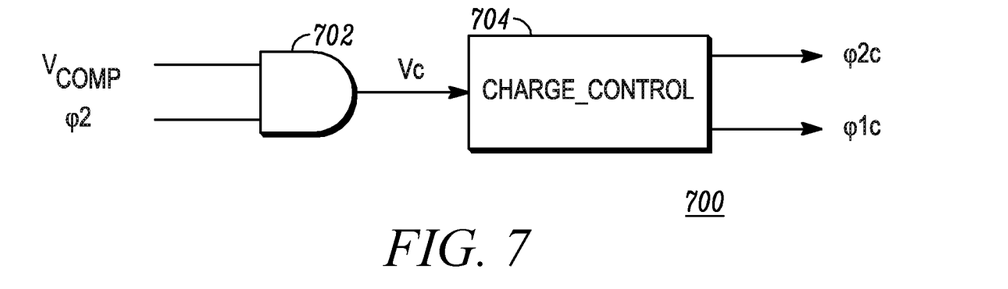
FIG. 7 is a simplified diagram of timing-generating circuitry, located within the adaptive $C_{BOOT}$ regulator, which generates timing signals for charging a boot-strapped capacitor.

FIG. 7 is a simplified diagram of timing-generating circuitry 700, located within the regulator 112 shown, which generates timing signals for charging $C_{BOOT}$ 130. The timing-generating circuitry 700 comprises an AND gate 702 having one input terminal for receiving the $V_{COMP}$ signal from the comparison signal-generating circuitry 600 and having another input terminal for receiving the clock signal φ2 from the clock-generating circuitry 200. The AND gate 702 outputs a signal $V_C$ to a charge control module 704. The charge control module 704 contains known circuitry that creates two non-overlapping timing signals, φ1c and φ2c, from a single timing signal, $V_C$. The charge control module 704 outputs timing signal φ1c that transitions to LOW a pre-selected first delay after $V_C$ transitions to HIGH and then transitions to HIGH a pre-selected second delay after $V_C$ transitions to LOW. The charge control module 704 also outputs timing signal φ2c that transitions to HIGH a pre-selected third delay after $V_C$ transitions to HIGH and then transitions to LOW when $V_C$ transitions to LOW, wherein the pre-selected third delay is longer than the pre-selected first delay. The HIGH time of φ2c is less than the HIGH time of φ2. The timing-generating circuitry 700 outputs timing signals φ1c and φ2c.

Figure 8:
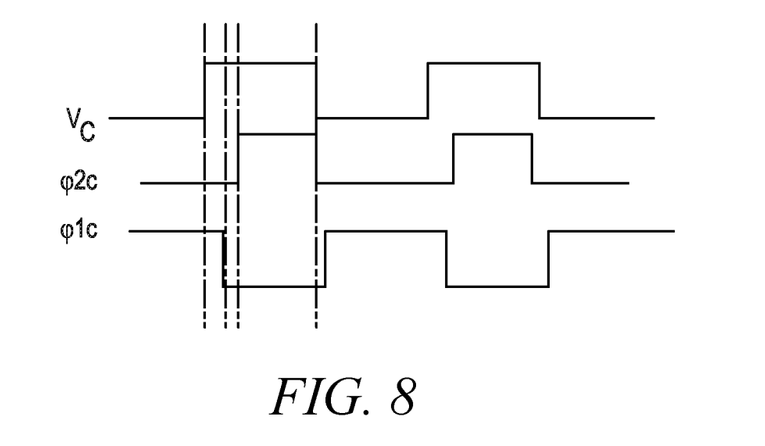
FIG. 8 is a graph of signals that appear in the timing-generating circuitry of FIG. 7.

FIG. 8 is a graph of signals $V_C$, φ1c and φ2c that appear in the timing-generating circuitry 700.

Figure 9:
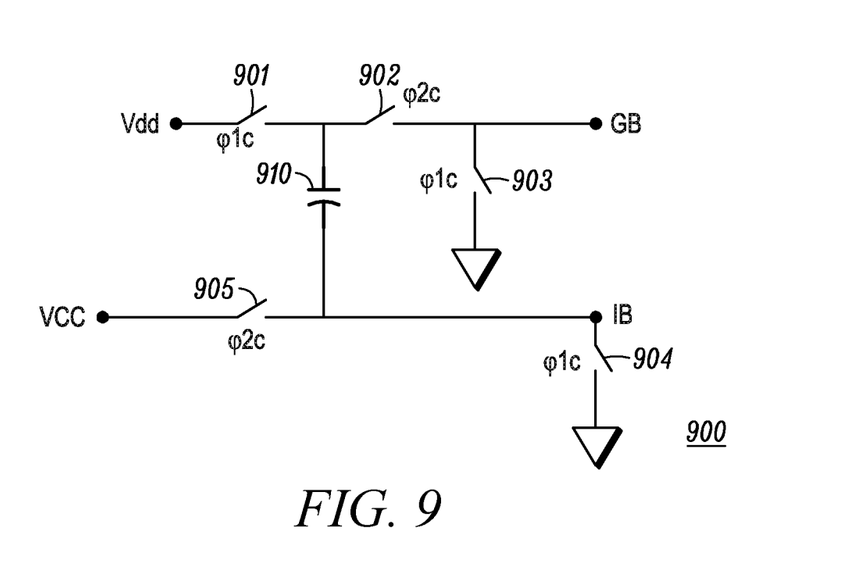
FIG. 9 is a simplified schematic of a third voltage generating circuitry, located within the adaptive $C_{BOOT}$ regulator, which generates a gate voltage and a source voltage for a charging device located in the high-side portion of the universal half-bridge.

FIG. 9 is a simplified schematic of a third voltage generating circuitry 900, located within the regulator 112, which generates a gate voltage GB and a source voltage IB for the charging device 123 located in the low-side portion 106 of the half-bridge 102. The third voltage generating circuitry 900 includes an input terminal for receiving $V_{DD}$ and another input terminal for receiving $V_{CC}$. In one embodiment, $V_{DD}$=6V. The third voltage generating circuitry 900 includes switches 901, 902, 903, 904 and 905 that are controlled by the timing signals φ1c and φ2c that are received from the timing-generating circuitry 700. The third voltage generating circuitry 900 includes switched-capacitor based circuitry. The third voltage generating circuitry 900 includes capacitor 910 whose voltage is controlled by the opening and closing of switches 901, 902, 903, 904 and 905. The third voltage generating circuitry 900 outputs signal GB and signal IB. The values of signal GB and signal IB depend on the timing signals φ1c and φ2c. Signal GB is coupled to a gate of the charging device 123 and signal IB is coupled to a source terminal of the charging device. Depending on the values of signal GB and signal IB, the charging device 123 conducts, thereby charging $C_{BOOT}$ 130. Depending on the values of signal GB and signal IB, the charging device 123 does not conduct, thereby insulating the CMOS devices of the interface portion 110 from high voltages in the high-side portion 104 of half-bridge 102. By "high voltages" it is meant voltages above the breakdown voltage of devices used.

The top plate of $C_{BOOT}$ 130 is charged using the direct-current (DC) supply voltage $V_{CC}$ from the interface portion 110. In one embodiment, $V_{CC}$=10V to 20V. The gate of the charging device 123 in the low-side portion 106 is controlled by the regulator 112. As the voltage on the top plate of $C_{BOOT}$ 130 builds up, the voltage GB also builds up because the half-bridge 102 is a boot-strapped circuit. As illustrated in FIG. 9, when φ1c is HIGH, a voltage across the capacitor 910 is $V_{DD}$. When φ2c is HIGH, the voltage across the capacitor 910 is (GB–IB). The GB voltage is (IB+$V_{DD}$). Therefore, as IB increases during the charging phase, the GB voltage increases by a same amount but the gate-to-source voltage across the charging device 123 remains at $V_{DD}$. There is some drop in the gate-to-source voltage across the charging device 123 as a result of charge lost due to a gate current of the charging device. The circuit is designed such that there is a minimal drop in gate-to-source voltage of the charging device 123 such that the charging device remains ON with low resistance during the charging phase. This helps in maintaining a constant low ON resistance of the charging device 123. In one embodiment, a frequency of operation for the half-bridge 102 is 1 MHz, i.e., period is 1 ms. The bottom plate of $C_{BOOT}$ 130 can vary from −2V to 650V. The voltage on the top plate of $C_{BOOT}$ 130 should be regulated to 6V±10% more than the voltage of the bottom plate.

Figure 10:
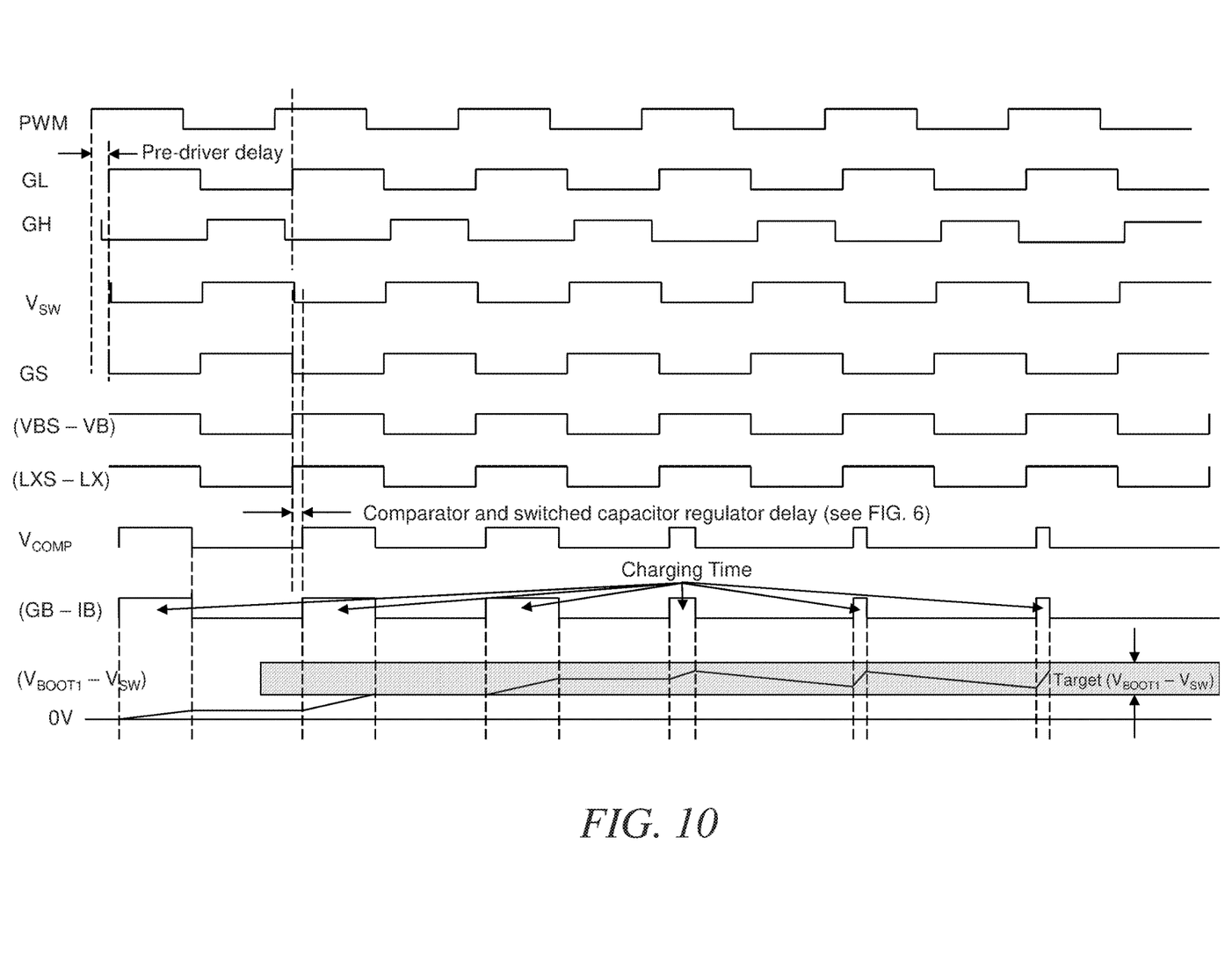
FIG. 10 is a graph of typical waveforms that appear in the universal half-bridge and in the adaptive $C_{BOOT}$ regulator of FIG. 1.

FIG. 10 is a graph of a typical timing sequence for the half-bridge 102 and the interface portion 110. FIG. 10 shows typical waveforms for signals, PWM, GL, GH, $V_{SW}$, GS, (VBS−VB), (LXS−LX), $V_{COMP}$, (GB−IB) and ($V_{BOOT1}$−$V_{SW}$) for a representative period. FIG. 10 shows that the signals GL, GH, $V_{SW}$ and GS are delayed with respect to PWM, which delay is caused by circuitry in the low-side pre-driver 124. FIG. 10 shows that $V_{COMP}$ is delayed with respect to VB and LX, which delay is caused by the switched-capacitor comparator network 602. FIG. 10 shows that the gate voltage GL of the low-side transistor 126 periodically goes LOW thereby turning OFF the low-side transistor because the low-side transistor is an N-channel, enhancement mode HEMT. FIG. 10 shows that the first sense device 121 and the second sense device 122 are ON only when the signal GS is LOW (which is inverse of gate voltage GL of the low-side transistor 126). FIG. 10 shows that the charging time is controlled by a duration that $V_{COMP}$ is HIGH which, in turn, depends upon the value of ($V_{BOOT1}$−$V_{SW}$). The charging time decreases as ($V_{BOOT1}$−$V_{SW}$) is closer to a target value, e.g., approximately 6V. Typically, the target value is slightly higher than 6V, i.e., 6V+DV. When the low-side transistor 126 is OFF and the high-side transistor 114 is ON, ($V_{BOOT1}$−$V_{SW}$) drops below 6V, i.e., 6V−DV. FIG. 10 shows a target range for ($V_{BOOT1}$−$V_{SW}$). In one embodiment, the target range is 6.3V to 5.7V. FIG. 10 also shows that the charging device 123 is ON, i.e., GB positive, only when ($V_{BOOT1}$−$V_{SW}$) is less than 6V and the low-side transistor 126 is ON.

The sensing (by the first sense device 121 and the second sense device 122) and the charging (by the charging device 123) occur only when the low-side transistor 126 is ON.

The use of GaN HEMTs for the first sense device 121, the second sense device 122 and the charging device 123 ensures that a high voltage of $V_{SW}$ is never propagated to the interface portion 110. The regulator 112 also ensures that there is no overshoot of the intended regulated voltage ($V_{BOOT1}$−$V_{SW}$). The value of $V_{SW}$ depends on the PWM signal and the application for which the universal half bridge 102 is used. The regulation of $C_{BOOT}$ 130 ensures that ($V_{BOOT1}$−$V_{SW}$) is maintained at the desired voltage for optimal efficient performance within the allowed reliability limit of the GaN technology.

The circuit 100 in accordance with the invention is used for high-voltage switching power supply applications. The half-bridge 102 with the interface circuit 110 is capable of handling hundreds of watts of power at 650V using GaN technology.

The regulator 112 regulates $C_{BOOT}$ 130 which provides the supply to the high-side portion 104. The regulator 112 provides a controlled low resistance charging path to $C_{BOOT}$ 130. Based on a sensed voltage difference between the top plate and the bottom plate of $C_{BOOT}$ 130, the charging the charging device 123 is turned ON (low resistance) by the regulator 112 to quickly charge $C_{BOOT}$ 130. The regulator 112 turns OFF the charging device 123 once $C_{BOOT}$ 130 is fully charged.

The regulator 112 eliminates a need for external components to charge $C_{BOOT}$ 130. In some known half-bridge circuits, a boot-strapped capacitor is charged using external diodes, i.e., diodes that are external to the known half-bridge circuit. In known half-bridge circuits having a boot-strapped capacitor, there is no control mechanism to charge the boot-strapped capacitor. In the half-bridge 102 in accordance with the invention, external components such as diodes are not needed because the half-bridge 102 includes a controlled charging mechanism. In the half-bridge 102, control of the charging of $C_{BOOT}$ 130 is moved within the regulator 112. In the half-bridge 102, control of the charging of $C_{BOOT}$ 130 is realized using switched-capacitor circuit techniques.

The regulator 112 ensures that $C_{BOOT}$ 130 is never over charged which is a common problem in known circuits. The regulator 112 has improved dynamic performance commensurate with a higher switching frequency of a GaN-based half-bridge circuit. The regulator 112 is not limited to controlling a power half-bridge topology circuit fabricated using GaN technology, can be used for controlling any power half-bridge topology circuit.

Advantageously, the regulator 112 allows operation up to at least 2 MHz and with a high bandwidth. The bandwidth of the regulator 112 needs to be greater than 10 to 20 times higher than a frequency of operation of its charging loop.

The sensing of both voltage of the top plate and the voltage of the bottom plate of $C_{BOOT}$ 130 makes the regulator 112 power efficient because charging is based solely on sensing the voltage across $C_{BOOT}$–$C_{BOOT}$ 130 is not overcharged at any condition because the charging device 123 charges $C_{BOOT}$ only when the regulator 112 determines that the voltage across $C_{BOOT}$ is less than 6V.

Advantageously, with the half-bridge 102, a voltage regulation error is minimal.

Advantageously, the regulator 112 has reduced power loss, a smaller footprint and lower cost compared to known circuits because the regulator 112 does not need additional voltage clamps across $C_{BOOT}$ 130.

Advantageously, the regulator 112 does not need any additional regulated supply voltage because the regulator itself does the regulation.

Some features of the present invention may be used in an embodiment thereof without use of other features of the present invention. As such, the foregoing description should be considered as merely illustrative of the principles, teachings, examples, and exemplary embodiments of the present invention, and not a limitation thereof.

These embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package or in a multichip package. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

Unless stated otherwise, terms such as "first" and "second" are used to arbitrarily distinguish between the elements that such terms describe. Thus, these terms are not necessarily intended to indicate temporal or other prioritization of such elements.

Unless stated otherwise, terms such as "top" and "bottom" are used to arbitrarily distinguish between the elements that such terms describe. Thus, these terms are not necessarily intended to indicate position or location of such elements.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/ dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:
1. An electrical circuit comprising:
a ground-referenced power transistor and a non-ground-referenced power transistor configured in a half-bridge topology, the non-ground-referenced power transistor having a first conducting electrode coupled to a high voltage power supply, a control electrode coupled to a high-side pre-driver, and a second conducting electrode coupled to a switch node;

a boot-strapped capacitor having a bottom plate coupled to the second conducting electrode for providing a floating-ground voltage thereto, and having a top plate coupled to the high-side pre-driver;

an interface portion including an adaptive boot-strapped capacitor regulator (hereinafter, "regulator"), wherein the interface portion selectively turns OFF and ON the ground-referenced power transistor and the non-ground-referenced power transistor;

a first sense device including a high-voltage, enhancement-mode, GaN HEMT for sensing a voltage at the top plate, having a gate terminal coupled to the regulator, a source terminal coupled to the regulator and a drain terminal coupled to the top plate through a diode;

a second sense device, coupled to the regulator, for sensing a voltage at the bottom plate; and a charging device coupled to the regulator and to the top plate, the charging device for selectively increasing the voltage at the top plate, wherein the regulator controls the charging device based on the voltage at the top plate and the voltage at the bottom plate.

2. The electrical circuit of claim 1, wherein the regulator controls the charging device based on a difference between the voltage at the top plate and the voltage at the bottom plate.

3. The electrical circuit of claim 2, wherein the charging device increases the voltage at the top plate when the difference between the voltage at the top plate and the voltage at the bottom plate is less than a target value.

4. The electrical circuit of claim 3, wherein the non-ground-referenced power transistor and the ground-referenced power transistor are GaN HEMTs, and wherein the target value is 6V±10%.

5. The electrical circuit of claim 1, wherein the regulator turns ON the first sense device and the second sense device only when the ground-referenced power transistor is ON.

6. The electrical circuit of claim 5, wherein the regulator includes a first voltage generating circuit comprising a first switched-capacitor circuit coupled to the gate terminal of the first sense device, wherein the first voltage generating circuit receives a signal representative of a gate voltage of the ground-referenced power transistor and, in response thereto, outputs to the gate terminal of the first sense device a voltage having a value sufficient to turn ON the first sense device.

7. The electrical circuit of claim 1, wherein the second sense device includes a high-voltage, enhancement-mode, GaN HEMT having a gate terminal coupled to the regulator, a source terminal coupled to the regulator and a drain terminal coupled to the bottom plate.

8. The electrical circuit of claim 7, wherein the regulator includes a second voltage generating circuit comprising a second switched-capacitor circuit coupled to the gate terminal of the second sense device, wherein the second voltage generating circuit receives a signal representative of a gate voltage of the ground-referenced power transistor and, in response thereto, outputs to the gate terminal of the second sense device a voltage having a value sufficient to turn ON the second sense device.

9. The electrical circuit of claim 1, wherein the charging device includes a high-voltage, enhancement-mode, GaN HEMT having a gate terminal coupled to the regulator, a source terminal coupled to the regulator and a drain terminal coupled to the top plate.

10. The electrical circuit of claim 9, wherein the regulator turns ON the charging device only when the ground-referenced power transistor is ON and in response to a difference between the voltage at the top plate and the voltage at the bottom plate.

11. The electrical circuit of claim 1, wherein the non-ground-referenced power transistor is an N-channel, enhancement-mode, GaN HEMT having a gate terminal coupled to the high-side pre-driver, a drain terminal coupled to the high voltage power supply, and a source terminal coupled to the switch node.

12. The electrical circuit of claim 11, wherein the high-side pre-driver selectively provides to the gate terminal of the non-ground-referenced power transistor one of a voltage at the switch node and a voltage derived from the voltage at the top plate, based on a signal from the interface portion.

13. An electrical circuit comprising:

a ground-referenced power transistor and a non-ground-referenced power transistor configured in a half-bridge topology, the non-ground-referenced power transistor having a first conducting electrode coupled to a high voltage power supply, a control electrode coupled to a high-side pre-driver, and a second conducting electrode coupled to a switch node;

a boot-strapped capacitor having a bottom plate coupled to the second conducting electrode for providing a floating-ground voltage thereto, and having a top plate coupled to the high-side pre-driver;

an interface portion including an adaptive boot-strapped capacitor regulator (hereinafter, "regulator"), wherein the interface portion selectively turns OFF and ON the ground-referenced power transistor and the non-ground-referenced power transistor, and wherein the regulator includes a comparison signal-generating circuit coupled to the source terminal of the first sense device, to the source terminal of the second sense device and to a reference voltage, the comparison signal-generating circuit further including a comparator, wherein the comparison signal-generating circuit determines a difference between a signal at the source terminal of the first sense device and a signal at the source terminal of the second sense device, and wherein the comparator compares the difference with the reference voltage and, in response thereto, produces a first intermediate signal;

a first sense device, coupled to the regulator, for sensing a voltage at the top plate;

a second sense device, coupled to the regulator, for sensing a voltage at the bottom plate; and a charging device coupled to the regulator and to the top plate, the charging device for selectively increasing the voltage at the top plate, wherein the regulator controls the charging device based on the voltage at the top plate and the voltage at the bottom plate, and wherein the comparison signal-generating circuit includes a de-glitch module that receives the first intermediate signal and that outputs a second intermediate signal representative of the first intermediate signal without any chattering that may be present in the first intermediate signal.

14. The electrical circuit of claim 13, wherein the comparison signal-generating circuit further includes:

an AND gate that receives the second intermediate signal at one input terminal and that outputs a charging pulse, a latch for storing a latest value of the charging pulse, and a one-shot module, coupled to an output terminal of the latch, that outputs a signal to another input terminal of the AND gate, wherein if charging of the boot-strapped capacitor is not complete in any cycle, then the comparison signal-generating circuit outputs the charging pulse without waiting for the de-glitch module to output the second intermediate signal.

15. The electrical circuit of claim 14, wherein the regulator includes a third voltage generating circuit comprising a third switched-capacitor circuit coupled to the gate and source terminals of the charging device, and in response to the charging pulse and timing signals, outputs to the gate terminal of the charging device a voltage having a value sufficient to turn ON the charging device.

16. The electrical circuit of claim 13, wherein the second sense device includes a high-voltage, enhancement-mode, GaN HEMT having a gate terminal coupled to the regulator, a source terminal coupled to the regulator and a drain terminal coupled to the bottom plate.

17. The electrical circuit of claim 13, wherein the charging device includes a high-voltage, enhancement-mode, GaN HEMT having a gate terminal coupled to the regulator, a source terminal coupled to the regulator and a drain terminal coupled to the top plate.

18. An electrical circuit comprising:
a ground-referenced power transistor and a non-ground-referenced power transistor configured in a half-bridge topology, the non-ground-referenced power transistor having a first conducting electrode coupled to a high voltage power supply, a control electrode coupled to a high-side pre-driver, and a second conducting electrode coupled to a switch node;

a boot-strapped capacitor having a bottom plate coupled to the second conducting electrode for providing a floating-ground voltage thereto, and having a top plate coupled to the high-side pre-driver;

an interface portion including an adaptive boot-strapped capacitor regulator (hereinafter, "regulator"), wherein the interface portion selectively turns OFF and ON the ground-referenced power transistor and the non-ground-referenced power transistor;

a first sense device, coupled to the regulator, for sensing a voltage at the top plate;

a second sense device, coupled to the regulator, for sensing a voltage at the bottom plate; and a charging device coupled to the regulator and to the top plate, the charging device for selectively increasing the voltage at the top plate, wherein the regulator controls the charging device based on the voltage at the top plate and the voltage at the bottom plate, wherein the ground-referenced power transistor is an N-channel, enhancement-mode, GaN HEMT having a drain terminal coupled to the switch node, a source terminal coupled to ground potential and a gate terminal coupled to a low-side pre-driver, wherein the low-side pre-driver selectively provides to the gate terminal of the ground-referenced power transistor a gate voltage having one of a value that turns ON the ground-referenced power transistor and another value that turns OFF the ground-referenced power transistor, based on a signal from the interface portion, and wherein the gate voltage of the ground-referenced power transistor is level shifted and inverted, and then fed back to the regulator.

19. The electrical circuit of claim 18, wherein the regulator controls the charging device based on a difference between the voltage at the top plate and the voltage at the bottom plate.

20. The electrical circuit of claim 18, wherein the non-ground-referenced power transistor is an N-channel, enhancement-mode, GaN HEMT having a gate terminal coupled to the high-side pre-driver, a drain terminal coupled to the high voltage power supply, and a source terminal coupled to the switch node.

* * * * *